United States Patent [19]

Somasundaran et al.

[11] 4,256,571
[45] Mar. 17, 1981

[54] RECOVERY OF SILICON CARBIDE WHISKERS FROM COKED, CONVERTED RICE HULLS BY SELECTIVE FLOCCULATION-LIQUID EXTRACTION

[75] Inventors: Ponisseril Somasundaran, Nyack; Kavssery P. Ananthapadmanabhan, New York, both of N.Y.

[73] Assignee: Silag, Inc., Greer, S.C.

[21] Appl. No.: 82,940

[22] Filed: Oct. 9, 1979

[51] Int. Cl.$^3$ .......................... B03B 1/04; B03B 5/60
[52] U.S. Cl. ..................................... 209/5; 209/163; 209/172; 241/24
[58] Field of Search ................... 209/5, 172, 163, 207, 209/171, 3; 423/345, 346; 241/24

[56] References Cited

U.S. PATENT DOCUMENTS

| | | | |
|---|---|---|---|
| 689,070 | 12/1901 | Elmore | 209/171 |
| 2,686,592 | 8/1954 | Miller | 209/163 |
| 3,243,284 | 3/1966 | Morelock et al. | 75/81 |
| 3,259,237 | 7/1966 | Schoeld et al. | 209/171 X |
| 3,268,071 | 8/1966 | Puddington et al. | 209/5 |
| 3,349,909 | 10/1967 | Studer | 209/207 |
| 3,432,030 | 3/1969 | Oliver | 209/171 X |
| 3,439,801 | 4/1969 | Morris et al. | 209/5 |
| 3,462,262 | 8/1969 | Koch et al. | 75/33 |
| 3,665,066 | 5/1972 | Capes et al. | 264/117 |
| 3,754,076 | 8/1973 | Cutler | 423/345 |
| 3,758,672 | 9/1973 | Lewis | 423/345 |
| 3,764,007 | 10/1973 | Schmid et al. | 209/211 |
| 3,836,356 | 9/1974 | Irani | 75/33 |
| 3,865,315 | 2/1975 | Roberts et al. | 241/4 |
| 3,920,446 | 11/1975 | Irani | 75/51 |
| 4,060,412 | 11/1977 | Divecha | 75/203 |
| 4,118,464 | 10/1978 | Cutler | 423/346 |

OTHER PUBLICATIONS

Mellgren et al., *Trans. Inst. Min. Metall.*, vol. 75, pp. C267-C268, 1966.
Lai et al., *Transactions of Society of Mining Engineers, Aime*, vol. 241, Dec. 1968, pp. 549-556.
Farnand et al., *The Canadian Journal of Chemical Engineering*, Apr. 1961, pp. 94-97.
Puddington et al., *Minerals Science Engineering*, vol. 7, No. 3, Oct. 1975.

*Primary Examiner*—Ralph J. Hill
*Attorney, Agent, or Firm*—Kenneth P. Glynn; Robert S. Salzman

[57] ABSTRACT

The present invention is directed to silicon carbide whisker recovery from a mixture of silicon carbide whiskers and carbonaceous silicon carbide particles. The invention involves shredding the mixture down to a specified size, dispersing the mixture in water to form an aqueous mixture, mixing in an effective amount of flocculating agent, agitating the aqueous mixture, mixing the aqueous mixture with an immiscible organic liquid, agitating the resulting water-organic liquid mixture, allowing settling of the aqueous mixture and organic liquid so as to establish two liquid phases, separating the two liquid phases into an organic liquid phase and an aqueous phase and, lastly, performing a solid-liquid separation on the aqueous phase, thereby obtaining from the aqueous phase the desired silicon carbide whiskers.

11 Claims, 3 Drawing Figures

RECOVERY OF SILICON CARBIDE WHISKERS FROM COKED, CONVERTED RICE HULLS BY SELECTIVE FLOCCULATION-LIQUID EXTRACTION

BACKGROUND OF THE INVENTION

1. Field of the Invention

The present invention is directed to a method of recovering silicon carbide whiskers from a mixture of silicon carbide whiskers and carbonaceous silicon carbide particles. More particularly, the present invention is directed to such recovery by using a series of specified steps, including selective flocculation-liquid/liquid extraction techniques.

2. Prior Art

Silicon carbide whiskers have in recent years been found to be particularly useful for reinforcing metal and other composite materials so as to enhance the physical properties thereof. Thus, for example, U.S. Pat. No. 4,060,412 to A. P. Divecha, describes the use of microscopic silicon carbide fibers in a mixture with metal particles so as to be randomly oriented, and the subsequent extrusion and casting to form very high strength composite material billets.

Silicon carbide whiskers may be produced using elemental materials such as is described in U.S. Pat. No. 3,758,672, wherein solid phase carbon and solid phase silicon are heated to specified temperatures in a hydrogen and chlorine atmosphere to form silicon carbide whiskers on a substrate. Alternatively, silicon carbide whiskers have been produced from natural materials such as is described in U.S. Pat. No. 3,754,076, wherein the silicon carbide whiskers are formed from the silica and the carbon which are naturally present in rice hulls. Each technique has its advantages and disadvantages. However, the method of producing silicon carbide from rice hulls appears to be more advantageous in that it is a method whereby one of the most abundant waste materials in the world is consumed. Nonetheless, when rice hulls are used as a starting material for the production of silicon carbide whiskers, a substantial amount of non-whisker residual material remains and an area of developing interest involves the separation of the silicon carbide whiskers from the other residual materials. To date, it is believed that relatively well-known mechanical screening and sifting means have been employed to separate the silicon carbide whiskers from residual materials with a minimum success, when formed from rice hulls.

Although the prior art is replete with many techniques for separating various solid materials from one another, it is believed that the method of the present invention, employing a selective flocculation-liquid/liquid extraction as well as other necessary steps, has not heretofore been contemplated or rendered obvious. Exemplary of the prior art is U.S. Pat. No. 3,243,284, which describes a method for collecting metal whiskers. This patent describes a process wherein the metal whisker growth substrate is immersed in mercury and wherein the mercury and substrate are vibrated and a liquid is added to the mercury which is non-reactive with respect to the whiskers and which is mixed with the mercury to transport the whiskers from the mercury into the liquid, followed by filtering. U.S. Pat. No. 3,439,801 is directed to a process for removing discoloring impurities which may be organic or graphitic in nature from a clay slip. The method described in this patent involves intimately contacting an aqueous slip of fine milled clay with a water insoluble, non-ionizable organic liquid and thereupon recovering the clay from the separated clay water base. The organic liquid is the sole chemical reagent necessary for the effective separation of the discoloring impurities from the fine milled clay in the slip. While this patent is directed to a liquid/liquid separation technique involving the use of water and a water insoluble non-ionizable organic liquid, it is not directed to the separation of whisker materials from other solids, much less the separation of silicon carbide whiskers made from rice hulls.

U.S. Pat. No. 3,462,262 describes a process for the recovery of excess carbon from the product of an iron ore direct reduction process. The method involves treating the iron ore containing the carbon with oil followed by flotation in water. U.S. Pat. No. 3,764,007 is directed to the separation of solid particles from solid particles having a different shape. The invention therein is directed to a process for such a separation using a suspension, without turbulence, at a specified velocity profile using rotary movement of two discs. U.S. Pat. No. 3,865,315 is directed to a process for separating fibrous material such as wool fiber from mixtures of fibrous material and adhered shot without substantially destroying the fiber length. This method involves passing a water suspension of the fibrous material and adhered shot through an attrition device to gently abrade the fiber shot interface, then diluting the abraded mixture with water, agitating the diluted mixture, and decanting to separate the substantially unbroken fibers from the now separated shot. While this patent is directed to removing fibrous material from shot material, it does not employ the present invention separation technique but rather relies ultimately upon gravity for removal of the shot.

U.S. Pat. No. 3,920,446 is directed to a method for treating siliceous materials to form silicon carbide for use in refining ferrous material. The method involves heating mixtures of SiC and iron product at elevated temperatures comminuting the resulting product from the heat treatment and separating the metallic iron from the silicon carbide magnetically. U.S. Pat. No. 3,836,356 is also directed to a process wherein metal iron is removed from silicon carbide residue magnetically. U.S. Pat. No. 3,665,066 is directed to beneficiation of coals using liquid agglomeration techniques and U.S. Pat. No. 3,268,071 is likewise directed to a process for the separation of solids by agglomeration using liquid/liquid techniques. U.S. Pat. No. 4,118,464 is directed to a process for separating silica from silicate bearing materials and includes discussion of the formation and separation of silicon carbide from such materials. It is disclosed that the silicon carbide fibers obtained by the process may be separated by a suitable conventional mechanical screen process at which time there may be obtained an excellent separation of the silicon carbide from a carbon matrix residue and other materials. While this patent is directed to a separation of silicon carbide from carbonaceous materials, it does not describe the selective flocculation-liquid/liquid separation technique of the present invention.

O. Mellgren et al, *Trans, Inst. Min. Metall.*, Vol. 75, pp. C267–C268, 1966 describe a method for recovering ultrafine mineral particles by extraction with an organic phase and an aqueous phase. R. W. M. Lai et al, *Transactions of Society of Mining Engineers, AIME*, Vol. 241, December, 1968, pp. 549-556, describe liquid/liquid extraction of ultrafine particles using water-oil separation, and J. R. Farnand et al, *The Canadian Journal of Chemical Engineering*, April, 1961, pp. 94-97, describe spherical agglomeration of solids in liquid suspension. I. E. Puddington et al, in *Minerals Science Engineering*, Vol. 7, No. 3, October, 1975, describe spherical agglomeration processes and include a discussion on mineral beneficiation using liquid techniques.

Lastly recently filed co-pending application, Ser. No. 53,738, filed on July 2, 1979, entitled "Recovery of Silicon Carbide Whiskers from Coked, Converted Rice Hulls by Liquid-Liquid Separation" to B. K. Parekh et al, assigned to Silag, Inc., is directed to silicon carbide whisker recovery from a mixture of silicon carbide whiskers and carbonaceous silicon carbide particles. The invention involves shredding the mixture down to a specified particle size, dispersing the mixture in water to form an aqueous mixture, agitating the aqueous mixture, mixing the aqueous mixture with an immiscible organic liquid which is lighter than water, agitating the resulting water-organic liquid mixture, allowing the organic liquid and its contents to rise above the water and its contents, separating the two liquid phases into an organic liquid phase and an aqueous phase, and, lastly, performing a solid-liquid separation on each of the two phases, thereby obtaining from the aqueous solution the desired silicon carbide whiskers and obtaining from the organic liquid a carbonaceous silicon carbide particle product. Also, recently filed co-pending application Ser. No. 53,737, filed on July 2, 1979, entitled "Recovery of Silicon Carbide Whiskers from Coked, Converted Rice Hulls by Froth Flotation", to B. K. Parekh et al, assigned to Silag, Inc., is directed to silicon carbide whisker recovery from a mixture of silicon carbide whiskers and carbonaceous silicon carbide particles. The invention involves shredding the mixture down to a specified particle size, dispersing the mixture in water to form an aqueous mixture, agitating the aqueous mixture, adding surface active reagents to the aqueous mixture, agitating the resulting water-reagent mixture, subjecting the water-reagent mixture to froth flotation having at least three stages, removing tailings therefrom containing water and silicon carbide whiskers and removing float therefrom containing reagents and carbonaceous silicon carbide particles, performing a solid-liquid separation on the tailings and the float, thereby obtaining from the aqueous solution the desired silicon carbide whiskers and obtaining from the reagent solution a carbonaceous silicon carbide particle product.

In summary, of all the prior art described herein, there is no teaching of the present invention nor is there any teaching that would render the present invention obvious.

BRIEF DESCRIPTION OF THE INVENTION

The present invention is directed to silicon carbide whisker recovery from a mixture of silicon carbide whiskers and carbonaceous silicon carbide particles. The invention involves shredding the mixture down to a specified size, dispersing the mixture in water to form an aqueous mixture, mixing in an effective amount of flocculating agent, agitating the aqueous mixture, mixing the aqueous mixture with an immiscible organic liquid, agitating the resulting water-organic liquid mixture, allowing settling of the aqueous mixture and organic liquid so as to establish two liquid phases, separating the two liquid phases into an organic liquid phase and an aqueous phase and, lastly, performing a solid-liquid separation on the aqueous solution, thereby obtaining from the aqueous mixture the desired silicon carbide whiskers. If also desired, the carbonaceous silicon carbide particles may be obtained from the organic liquid by solid-liquid separation.

DETAILED DESCRIPTION OF THE PRESENT INVENTION

Figure 1:
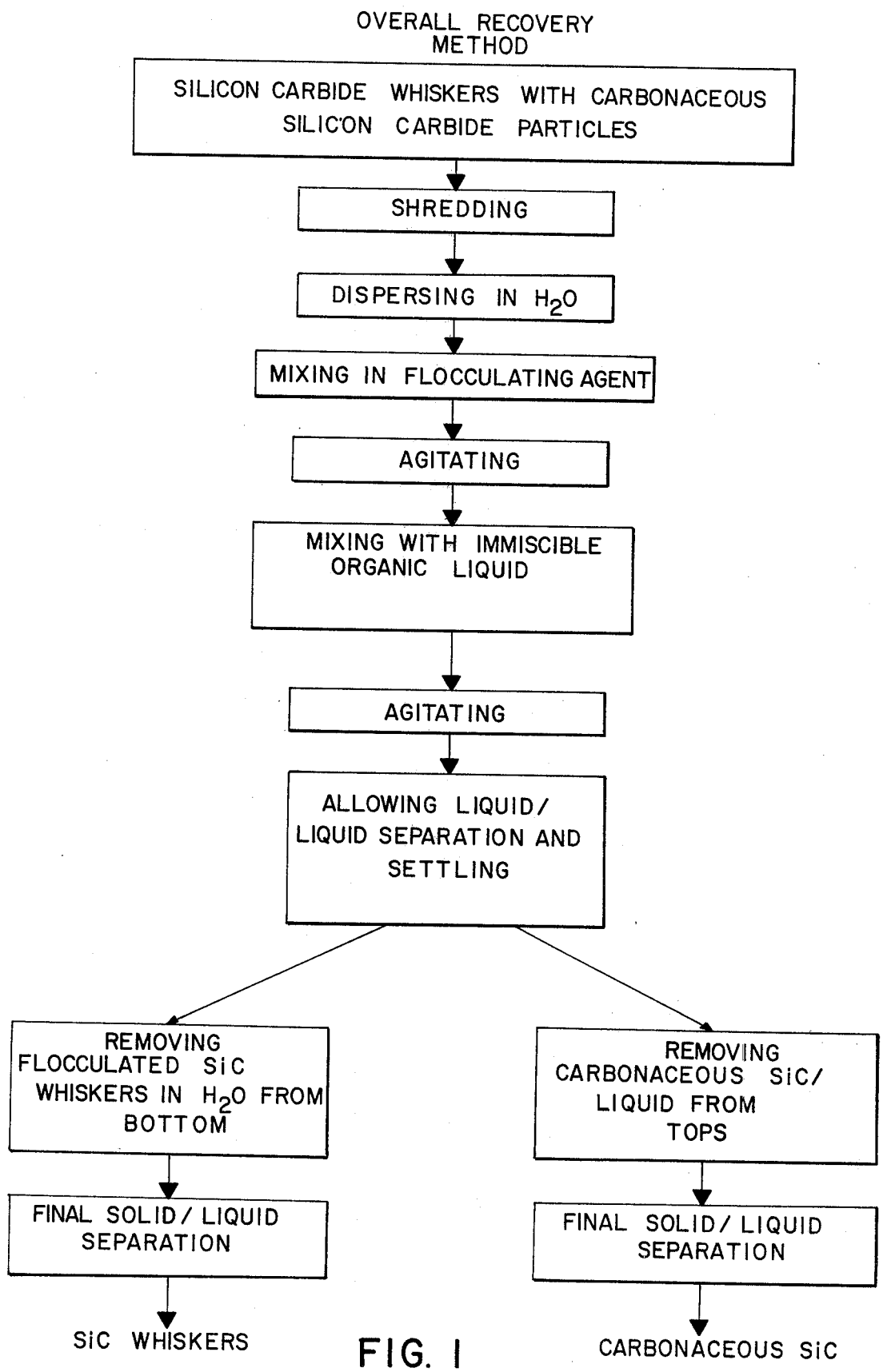
FIG. 1 shows a schematic flow diagram on a step-by-step basis of a preferred embodiment of the method of the present invention for the separation and recovery of silicon carbide whiskers from a mixture of silicon carbide whiskers and carbonaceous silicon carbide particles.

Silicon carbide may be formed by conversion of rice hulls at elevated temperatures under selected atmospheric conditions as described in the prior art above. The resulting silicon carbide whiskers, formed from the silica and the carbon content of the rice hulls, also contain non-whisker silicon carbide and unreacted carbon or coke material. In view of the fact that less than all of the silicon carbide produced is whisker-like, it has been recognized that silicon carbide whiskers and silicon carbide particles are both hydrophilic and that, therefore, liquid/liquid separation techniques employing water as one of the media would not be effective. Thus, for example, one technique which may be used for separating the whiskers from the silicon carbide non-whiskers particles and the carbonaceous material involves burning off the carbonaceous material at very high temperatures, and then removing the silicon carbide particles from the silicon carbide whiskers by mechanical means. However, this technique has had a minimum of success.

It has recently been discovered that silicon carbide whiskers which are grown from rice hulls are formed into a natural mat of the whiskers and silicon carbide particles and carbonaceous material and, most importantly, that the silicon carbide particles are either coated with or otherwise connected to the carbonaceous materials. It has further been discovered that controlled shredding of the mat without excess pressure and without harsh milling will break up the fibrous mat, liberating whiskers and without removing the carbonaceous coating from the silicon carbide particles. The clean silicon carbide whiskers are naturally hydrophilic and the carbonaceous coated silicon carbide was found to be hydrophobic. By using these unique characteristics of the materials, aqueous liquid/liquid separation may be effected.

It has now been discovered that, in addition, selective flocculation may be effected so as to enhance the separation of the whiskers not only from the particles and liquid but also from its own water. This enables the separation to be accomplished with minimum volumetric handling, yet with excellent separation results. Thus, the present invention is directed to a method of separating silicon carbide whiskers from carbonaceous silicon carbide particles by using a selective flocculation-liquid/liquid extraction.

The method of the present invention involves first shredding the silicon carbide whiskers and carbonaceous silicon carbide so as to break up the fibrous mat which is naturally formed in the silicon carbide whisker growing process. This shredding step may advantageously be performed using a hammer mill shredder or its equivalent. In fact, any shredder may be employed provided that the carbonaceous silicon carbide particles contained in the mixture which is being worked on are not broken up so as to separate the carbonaceous material from the silicon carbide particles. (Whether or not a particular shredding technique would be detrimental to the carbonaceous silicon carbide particles may be determined by micrographic inspection, or, alternatively, by following the process of the present invention to determine whether or not it is effective.)

Shredding of the mat containing the silicon carbide whiskers and the carbonaceous silicon carbide particles should be performed until a maximum particle size of −10 mesh, and preferably −5 mesh, is obtained. In addition to shredders, apparatus such as screens may be employed. While screening is optional and the specified size particles may be obtained with shredders such as a hammer mill, screening provides an excellent quality control mechanism. In either case, the shredding is essential to the method of the present invention. Thus, it is by this shredding down to the specified size that a partial liberation of the whiskers from the carbonaceous silicon carbide particles is effected without detrimentally harming the integrity of the carbonaceous silicon carbide particles which remain with the whiskers.

The next step in the method of the present invention involves dispersing the shredded silicon carbide whisker-carbonaceous silicon carbide particle mixture in water. In general, dispersion in water is carried out so as to yield a liquid of about 1 to about 15% by weight of solids and preferably from about 5 to about 10% by weight of these solids. If desired, optional dispersing agents such as sodium pyrophosphate, sodium metaphosphate, sodium silicate or a combination of sodium carbonate and sodium hydroxide may be employed. Of these, preferred dispersing agents are sodium silicate, and mixtures of sodium carbonate and sodium hydroxide.

Next, an effective amount of flocculating agent is mixed with the water dispersion to effect selective flocculation. Although an "effective amount" may be determined readily by employing different amounts and observing which amounts work, it should be noted that the exact amount used, to be effective, may vary from agent to agent. Nonetheless, in general, about 0.5 to about 5 grams of flocculating agent, and preferably about 1.5 to about 3.0 grams of agent should be employed per liter of water dispersion. Also, it is important that the flocculating agent selectively flocculate he SiC whiskers and not the carbonaceous SiC particles. The selective flocculants which work in the present invention include inorganic as well as organic agents. Among the inorganic flocculating agents which may be employed is the preferred agent, aluminum sulfate, among the inorganic agents useful in the present invention are the nonionic polymers, as well as the anionic polymer and the cationic polymer flocculating agents, e.g., polyacrylamides, polyimines, polystyrene, sulfonates and the like.

After the materials are dispersed in water and the flocculating agent has been mixed in, the resulting mixture is subjected to agitation. This agitation enhances the final liberation of the silicon carbide whiskers from the carbonaceous silicon carbide particles and the dispersion thereof in the water. The agitation may be carried out by using ultrasonics, by a mechanical blender technique using, for example, a Waring blender, or the materials may otherwise be agitated by a mechanical agitator or any other type of agitator which will not harm the integrity of the carbonaceous silicon carbide particles and the whiskers.

After agitation, the aqueous mixture is combined with an immiscible hydrocarbon liquid which may be heavier or lighter than water. Any such hydrocarbon liquid may be employed which will preferentially wet carbon surface, including kerosene, mineral spirits, light fuel oils and the like. Kerosene is preferred. In general, a ratio of about one part by volume of organic liquid to about 5 parts of aqueous dispersion up to a ratio of about 1 part by volume of organic liquid to about 30 parts by volume of aqueous dispersion may be employed. Within this range, a ratio of 1 part by volume of organic liquid to about 5 parts by volume of aqueous dispersion up to about 1 part by volume of organic liquid to about 20 parts by volume of aqueous dispersion is preferred.

After the immiscible organic liquid and the aqueous dispersion are mixed, agitating is again employed. This agitation may involve stirring or shaking or any other agitation technique which will effectively cause the organic liquid and the water to substantially intermingle.

After this agitation, the two liquids are allowed to separate and settle. When the hydrocarbon liquid is lighter than water, the hydrocarbon liquid layer rises out on top of the water layer and contains the hydrophobic carbonaceous silicon carbide particles, whereas the water layer at the bottom forms two zones, the upper zone of which is substantially water (i.e., contains a small amount of solids relative to the remainder of the liquids) and the lower zone which contains the flocculated SiC whiskers.

The two liquid phases are next separated from one another, e.g., by decanting, and then the solids are respectively separated from their liquids by known liquid/solids techniques whereby the water phase and the silicon carbide whiskers contained therein are separated from one another, and whereby the hydrocarbon liquid and the carbonaceous silicon carbide particles contained therein are separated from one another.

The foregoing steps employed in the method of the present invention are shown in the form of a block flow diagram in FIG. 1 of the attached drawings.

Figure 2:
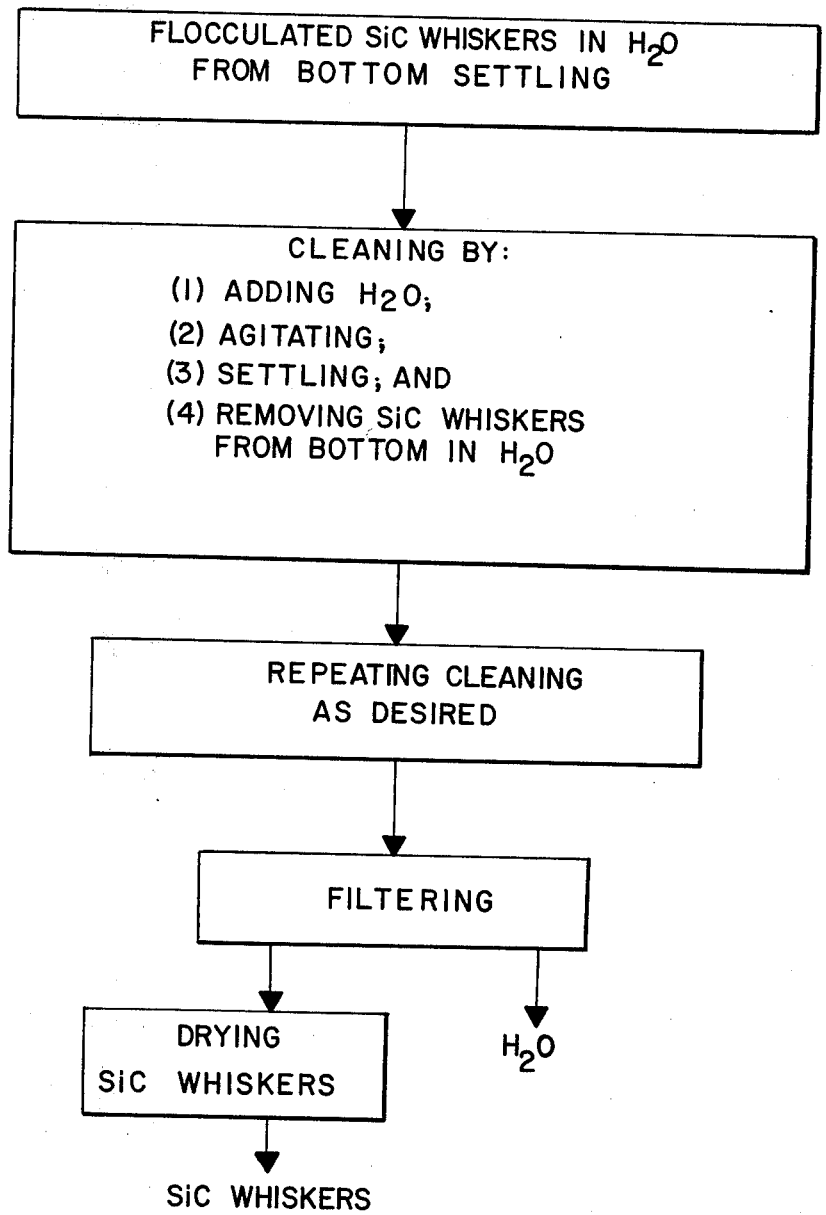
FIG. 2 shows a schematic flow diagram of a preferred method of the present invention final solid-liquid separation of SiC whiskers in $H_2O$ from selective flocculation; and, FIG. 3 shows a schematic flow diagram of a preferred method of the present invention final solid-liquid separation of carbonaceous SiC/solvent from tops.

FIG. 2 illustrates an optional yet preferred approach to the final solid/liquid separation of the SiC whiskers from the water after removal from the selective flocculation step as bottoms, shown in FIG. 1. The bottoms are cleaned by adding water to dilute, agitating, allowing to settle, and removing SiC whiskers from the new bottoms. This cleaning step is repeated as desired and the bottoms are subsequently filtered to filter the whiskers out of the water. Lastly, the SiC whiskers are dried by conventional drying means.

Figure 3:
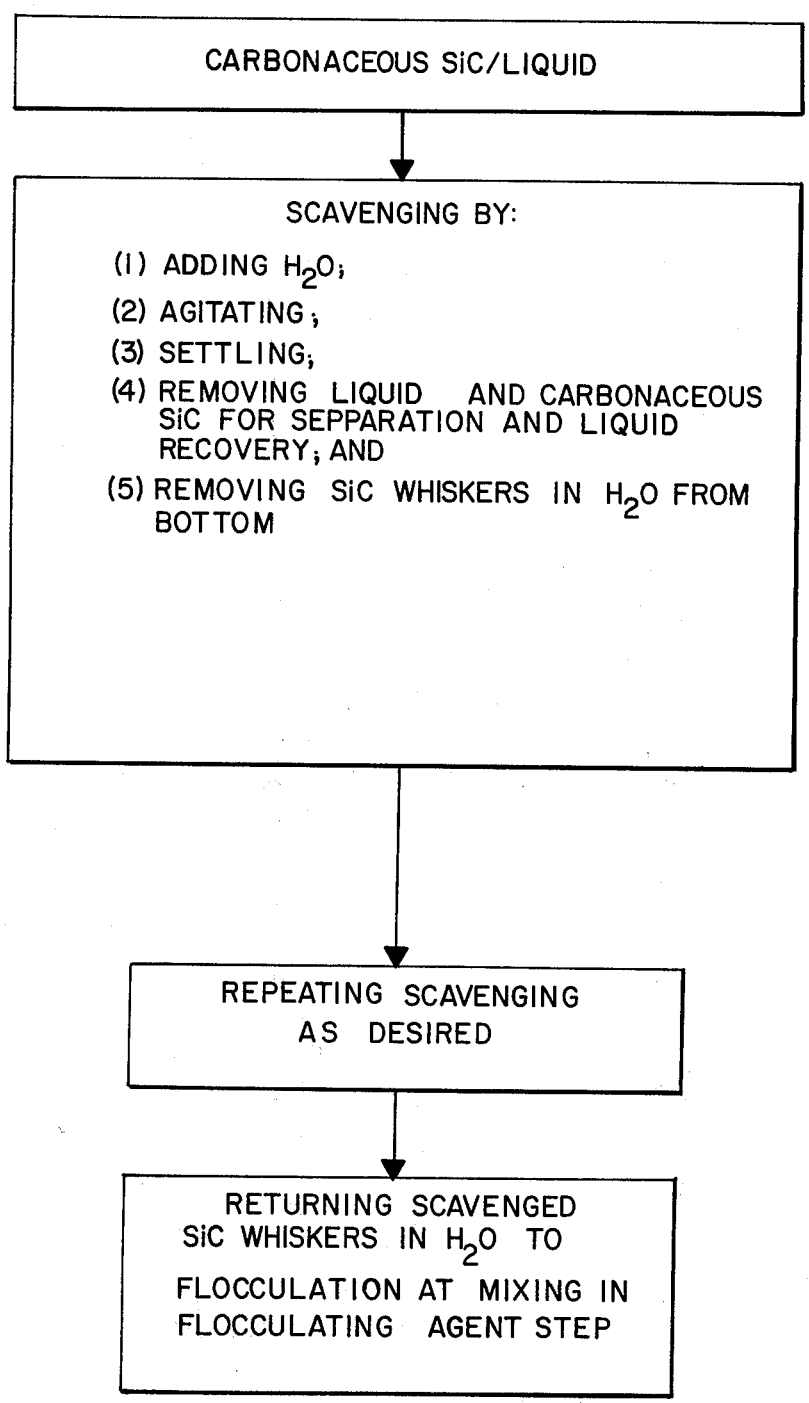

FIG. 3 illustrates an optional yet preferred method of final solid/liquid separation of the carbonaceous SiC/organic liquid obtained from the tops of the flocculation step of FIG. 1. In this approach, scavenging is accomplished by adding water to the liquid containing the carbonaceous SiC particles, agitating, allowing the mixture to settle and separate, removing liquid and carbonaceous SiC from the tops for separation and liquid recovery, and removing SiC whiskers in water as bottoms. This scavenging method is repeated as desired and, ultimately, the scavenged SiC whiskers in water are returned to the method shown in FIG. 1 at the step wherein the flocculating agent is mixed in. This is done so as to include the scavenged SiC whiskers in water in the subsequent overall recovery steps, including selective flocculation.

Equivalent and alternative steps to those described specifically above should now be apparent to the artisan without exceeding the scope of the present invention. The present invention is more fully illustrated by the following examples.

EXAMPLES 1 to 73

Converted rice hull silicon-carbide-containing product as obtained from an induction furnace was found to consist of a mat which could not be dispersed as such in water. Photomicrographs of the coked and converted rice hulls showed carbonaceous silicon carbide particles embedded loosely in a mat of silicon carbide whiskers. The mat was broken up carefully using spatulas so as to pass through a five mesh (0.15″) screen.

Two grams samples were weighed for each example and were transferred to a 250 ml separatory funnel. 150 ml of distilled water were added to the system and the feed material was dispersed in the aqueous phase by shaking the funnel using a wrist action shaker for five minutes. Ten ml of a 5% solution of $Al_2(SO_4)_3$ were introduced into the system and the agitation was continued for another 3 minutes. Finally, a 10 ml of kerosene were added and the resulting mixture was agitated for five minutes. Agitation led to the formation of several kerosene droplets in the aqueous phase. Carbon-coated SiC particles being naturally hydrophobic were collected by the kerosene droplets. This resulted in a change with time of the color of the water, from black to greyish green which is that of the silicon carbide whiskers. After agitation, the mixture was left undisturbed for another five minutes during which time the kerosene phase with the carbonaceous SiC particles separated out. Simultaneously, greyish green silicon carbide whisker particles were found to settle to the bottom of the water leaving a clear zone of water above it.

Settled product bottoms were transferred to a second separatory funnel and were agitated for two more minutes without any further addition of reagents. This allowed the entrapped carbon particles to float yielding a cleaner silicon carbide product.

The kerosene phase containing the carbonaceous SiC particles from the first separatory funnel was remixed with 150 ml of water and agitated for five minutes to recover entrapped silicon carbide whiskers. These silicon carbide whiskers were further cleaned.

The silicon carbide whiskers obtained after the cleaning were filtered, dried in the oven and weighed to calculate percent recovery.

Experimental conditions used for processing these examples are given in Table 1.

TABLE I

| CONDITIONS USED FOR EXAMPLES 1 TO 73 EXPERIMENTS | |
| --- | --- |
| Weight of the Sample | 2 gms. |
| Solid/Liquid Ratio | 1:75 |
| Aluminum Sulfate | 0.25 gms/gm of feed |
| Kerosene | 5 ml/gm of feed |
| Precontact Time | 5 minutes |
| Reagentizing Time | 3 minutes |
| Liquid/Liquid Contact Time | 5 minutes |
| Settling Time | 5 minutes |

EXAMPLES 74 TO 79

Subsequently, the tests used above were scaled up to treat 500 and 750 gram samples instead of 2 gram samples. They were conducted in 16 gallon Nalgene tanks with Lightnin stirrer (Model 10) to agitate the system. Solid/liquid ratio used in these tests was 1/60 as opposed to 1/75 in the separatory funnel experiments. Tyical test conditions are given in Table II.

TABLE II

| CONDITIONS USED FOR 750 GRAMS OF FEED MATERIAL | |
| --- | --- |
| Weight of the Sample | 750 gms. |
| Solid/Liquid Ratio | 1/60 |
| Aluminum Sulfate | 0.2 gms/gms of the feed |
| Kerosene | 1 m./gms of the feed |
| Precontact Time | 5 minutes |
| Reagentizing Time | 3 minutes |
| Liquid/Liquid Contact Time | 5 minutes |
| Settling Time | 5 minutes |
| Stirrer: | Lightnin Model 10 Stirrer used at the maximum speed. |
| Container: | 16 gal. Nalgene Tanks and 4 × 4 gal. plastic containers. |

The product of the first separation from the Nalgene tank was collected in 4 plastic containers of about 4 gallons capacity each and were further stirred for one minute. This enhanced the removal of the entrapped carbonaceous SiC to the liquid surface. Within 3 to 5 minutes after the stirring, substantially all the silicon carbide whiskers setled at the bottom of the container and hence a clear water phase was observed just below the carbonaceous SiC/kerosene layer. The carbonaceous SiC-organic liquid mixture was skimmed off from the top. The process of cleaning was repeated until no more carbonaceous SiC appeared after stirring. In most cases this involved as many as 4 to 5 cleaning stages. The supernatant phase containing negligible amounts of silicon carbide whiskers are decanted and the settled product was filtered using suction. The entrapped silicon carbide whisker particles in the carbonaceous SiC-organic liquid mixture separated during the first step was recovered by rediluting and dispersing the kerosene phase with water. This scavenged product was further subjected to the above-mentioned cleaning cycles.

It was found that the addition of 50 ml of kerosene during the first cleaning stage reduced the total number of cleaning cycles.

A mild spray of water over the separated kerosene phase was found to free the entrapped silicon carbide whiskers during the initial as well as the cleaning stages.

Results of the foregoing Examples varied significantly in terms of percent silicon carbide whiskers obtained based on the total weight of solids passed through the system. This was the result of the changes in the variables, such as temperature during the conversion process.

Table III illustrates the results of the selective flocculation-liquid/liquid separation of the present invention for Examples 1 through 73 and Table IV, the results for Examples 74 through 79.

TABLE III

RESULTS OF SELECTIVE FLOCCULATION LIQUID/LIQUID SEPARATION TESTS ON EXAMPLES 1-73

| Example No. | Sample | % Silicon Carbide Whiskers (Settled Material) Based on Total Solids |
|---|---|---|
| 1 | TE-16 | 0.7 |
| 2 | TE-17 | 3.3 |
| 3 | TE-19 | 9.5 |
| 4 | TE-20 | 9.1 |
| 5 | TE-21 | 9.0 |
| 6 | TE-22 | 6.3 |
| 7 | TE-26 | 14.0 |
| 8 | TE-31 | 8.8 |
| 9 | P-5 | 91.2 |
| 10 | P-5 (Repeat) | 87.9 |
| 11 | P-6 | 93.7 |
| 12 | P-6 (Repeat) | 91.6 |
| 13 | 107 | 8 |
| 14 | 108 1 | 35 |
| 15 | 108 2 | 36.5 |
| 16 | 108 3 | 34.5 |
| 17 | 108 4 | 30 |
| 18 | 108 5 | 35.5 |
| 19 | 108 6 | 32.5 |
| 20 | 108 7 | 38.2 |
| 21 | 108 8 | 21 |
| 22 | 108 9 | 25 |
| 23 | 108 10 | 24 |
| 24 | 108 11 | 33 |
| 25 | 108 11 (Repeat) | 28 |
| 26 | 108 11-1 | 24 |
| 27 | 108 11-2 | 21 |
| 28 | 108 11-3 | 30.5 |
| 29 | 108 11-4 | 24 |
| 30 | 108 12 | 21.8 |
| 31 | 108 13 | 23.5 |
| 32 | 108 14 | 22 |
| 33 | 108 15 | 26.5 |
| 34 | 108 16 | 29 |
| 35 | 108 17 | 27.5 |
| 36 | 108 18 | 27.8 |
| 37 | 108 19 | 31.4 |
| 38 | 108 21 | 19.3 |
| 39 | 108 1-1 | 36 |
| 40 | 108 1-2 | 24 |
| 41 | 108 1-3 | 32 |
| 42 | 108 1-3 (Repeat) | 33 |
| 43 | 108 1-4 | 33.3 |
| 44 | 109 1 | 7.4 |
| 45 | 109 1-1 | 11.75 |
| 46 | 109 1-2 | 3 |
| 47 | 109 1-3 | 2.5 |
| 48 | 109 1-4 | 1 |
| 49 | 109 2 | 6.5 |
| 50 | 109 3 | 7 |
| 51 | 109 4 | 10.5 |
| 52 | 109 5 | 9.8 |
| 53 | 109 6 | 10 |
| 54 | 109 7 | 8.5 |
| 55 | 109 8 | 10.5 |
| 56 | 109 9 | 10 |
| 57 | 109 10 | 12.5 |
| 58 | 109 11 | 13 |
| 59 | 109 11-1 | 15 |
| 60 | 109 11-2 | 12 |
| 61 | 109 11-3 | 14 |
| 62 | 109 11-4 | 8.5 |
| 63 | 109 12 | 10.5 |
| 64 | 109 13 | 9.5 |
| 65 | 109 14 | 8.5 |
| 66 | 109 15 | 9.5 |
| 67 | 109 16 | 8.8 |
| 68 | 109 17 | 9 |
| 69 | 109 18 | 9.5 |
| 70 | 109 19 | 6 |
| 71 | 109 20 | 4.5 |
| 72 | 109 21 | 1.8 |
| 73 | 110 bottom half | 13 |

TABLE IV

RESULTS OF SELECTIVE FLOCCULATION LIQUID/LIQUID SEPARATION TESTS FOR SCALE-UP EXAMPLES 74-79

| Example No. | Sample | Quantity of Feed Material (gms.) | % Silicon Carbide Whiskers (Settled Material) Based on Total Solids |
|---|---|---|---|
| 74 | TE-3 | 750 | 22 |
| 75 | TE-3 | 500 | 28 |
| 76 | #105 | 500 | 26 |
| 77 | #105 | 500 | 26 |
| 78 | #106 | 500 | 26 |
| 79 | #106 | 500 | 26 |

Isooctane, instead of kerosene as the organic liquid also yielded clean silicon carbide whiskers using the method of the present invention.

Also, it should be noted that the separation procedure for 750 gram sample discussed above was successfully used to produce up to about 3 kilograms of clean silicon carbide. Successful scale-up of this technique from 2 gms. to 750 gms. suggests that the selective flocculation liquid/liquid extraction can readily be employed as a viable industrial process for the recovery of silicon carbide whiskers.

What is claimed is:

1. A method for separating silicon carbide whiskers from a mixture of silicon carbide whiskers with carbonaceous silicon carbide particles comprising:
    (i) shredding the mixture to a specified size;
    (ii) dispersing the shredded mixture in water to form an aqueous mixture;
    (iii) mixing in an effective amount of flocculating agent;
    (iv) agitating the aqueous mixture;
    (v) mixing the aqueous mixture with an immiscible organic liquid;
    (vi) agitating the aqueous mixture and organic liquid;
    (vii) allowing settling of the aqueous mixture and organic liquid so as to establish two liquid phases comprising a first phase including said organic liquid and a second phase, including said water, said second phase having an upper zone of substantially water and a lower zone of flocculated SiC whiskers;
    (viii) separating the two liquid phases; and
    (ix) separating the solids from the aqueous mixture, thereby obtaining silicon carbide whiskers from the aqueous mixture.

2. The method of claim 1 wherein said shredded mixture is dispersed in water so as to contain about 1 to about 15% by weight of solids.

3. The method of claim 1 wherein said organic liquid is mixed with said aqueous mixture in a volume ratio of about 1 to 5 up to about 1 to 30.

4. The method of claim 1 wherein said organic liquid is selected from the group consisting of kerosene, mineral spirits and light fuel oils.

5. The method of claim 2 wherein said shredded mixture is dispersed in water so as to contain about 5 to about 10% by weight of solids.

6. The method of claim 1 wherein said organic liquid is mixed with said aqueous mixture in a volume ratio of about 1 to 5 up to about 1 to 20.

7. The method of claim 1, 2, 4, 5, or 6 wherein said flocculating agent is aluminum sulfate.

8. The method of claim 1, 2, 4, 5, or 6 wherein said liquid phase separation also includes separating the upper zone water from the lower zone water containing said flocculated SiC whiskers.

9. The method of claim 1, 2, 4, 5, or 6 wherein said shredding is performed so as to render a particle size of minus ten mesh.

10. The method of claim 1, 2, 3, 4, 5, or 6 wherein said shredding is performed so as to render a particular size of minus five mesh.

11. The method of claim 1, wherein said carbonaceous silicon carbide particles are obtained from said organic liquid by solid-liquid separation.

* * * * *